(12) United States Patent
Li et al.

(10) Patent No.: US 12,745,617 B2
(45) Date of Patent: Sep. 22, 2026

(54) IMPROVING VIA RESISTANCE TO BACKSIDE POWER RAIL

(71) Applicant: International Business Machines Corporation, Armonk, NY (US)

(72) Inventors: Tao Li, Slingerlands, NY (US); Sagarika Mukesh, Albany, NY (US); Liqiao Qin, Albany, NY (US); Prabudhya Roy Chowdhury, Albany, NY (US); Kisik Choi, Watervliet, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 17/946,740

(22) Filed: Sep. 16, 2022

(65) Prior Publication Data

US 2024/0096752 A1 Mar. 21, 2024

(51) Int. Cl.
*H10W 20/20* (2026.01)
*H10D 62/13* (2025.01)
(Continued)

(52) U.S. Cl.
CPC .......... *H10W 20/20* (2026.01); *H10D 62/151* (2025.01); *H10D 84/013* (2025.01);
(Continued)

(58) Field of Classification Search
CPC . H10W 20/069; H10W 20/076; H10W 20/20; H10W 20/057; H10W 20/056;
(Continued)

(56) References Cited

U.S. PATENT DOCUMENTS 9,570,395 B1 2/2017 Sengupta et al.
10,586,765 B2 3/2020 Smith et al.
(Continued)

OTHER PUBLICATIONS

Gupta, A., Radisic, D., Maes, J. W., Pedreira, O. V., Soulié, J. P., Jourdan, N., . . . & Horiguchi, N. (Dec. 2021). Buried Power Rail Metal exploration towards the 1 nm Node. In 2021 IEEE International Electron Devices Meeting (IEDM) (pp. 22-25). IEEE.
(Continued)

*Primary Examiner* — Sonya McCall-Shepard
(74) *Attorney, Agent, or Firm* — Seed Intellectual Property Law Group LLP

(57) ABSTRACT

A semiconductor device includes a backside power rail; a transistor source/drain structure that has a backside facing the backside power rail and has a frontside facing away from the backside power rail; and a via disposed between and electrically connecting the backside power rail and the source/drain structure. The via includes a buried portion that is disposed between the backside power rail and the backside of the transistor source/drain structure. A part of the buried portion overlaps and contacts at least a part of the backside of the source/drain structure. The via also includes a side portion that is electrically connected with the buried portion and extends along a vertical side of the source/drain structure between the frontside and the backside; and a top portion that is electrically connected with the side portion and covers at least a part of the frontside of the source/drain structure.

13 Claims, 10 Drawing Sheets

(51) Int. Cl.

| | |
|---|---|
| ***H10D 84/01*** | (2026.01) |
| ***H10D 84/03*** | (2025.01) |
| ***H10W 20/00*** | (2026.01) |
| ***H10W 20/40*** | (2026.01) |
| ***H10W 20/41*** | (2026.01) |

(52) U.S. Cl.
CPC ..... *H10D 84/0149* (2025.01); *H10D 84/0151* (2025.01); *H10D 84/038* (2025.01); *H10W 20/056* (2026.01)

(58) Field of Classification Search
CPC ............. H10W 20/023; H10W 20/427; H10W 20/0698; H10W 20/40; H10W 20/0245; H10W 20/481; H01L 23/481; H01L 21/76897; H01L 21/76831; H01L 21/76877; H01L 21/76879; H01L 21/76898; H01L 21/743; H01L 23/5286; H01L 21/76895; H10D 30/6219; H10D 62/151; H10D 64/251; H10D 64/254; H10D 84/0149; H10D 84/013
See application file for complete search history.

(56) References Cited

U.S. PATENT DOCUMENTS

| | | | | |
|---|---|---|---|---|
| 10,636,739 | B2 | 4/2020 | Beyne et al. | |
| 10,700,207 | B2 | 6/2020 | Chen et al. | |
| 10,770,479 | B2 | 9/2020 | Smith | |
| 10,872,818 | B2 | 12/2020 | Chiang | |
| 11,195,797 | B2 | 12/2021 | Vadi | |
| 2020/0105671 | A1 | 4/2020 | Lai et al. | |
| 2021/0366907 | A1 | 11/2021 | Liao | |
| 2024/0021708 | A1* | 1/2024 | Lan ...................... | H10D 30/024 |

OTHER PUBLICATIONS

Sadangi, S. (2021). FreePDK3: A Novel PDK for Physical Verification at the 3nm Node.
James Dick. "Pat Gelsinger Takes us on a Trip Down Memory Lane—and a Look Ahead", Intel CEO Pat Gelsinger—'Intel Innovation' Keynote, 1971, accessed webpage on Feb. 20, 2026, 13 pages.
Mathur et al. "Buried Bitline for sub-5nm SRAM Design", 2020 IEEE International Electron Devices Meeting (IEDM), Dec. 12-18, 2020, 4 pages.

* cited by examiner

IMPROVING VIA RESISTANCE TO BACKSIDE POWER RAIL

BACKGROUND

The present invention relates to the electrical, electronic, and computer arts, and more specifically, to fabrication of semiconductor devices.

Providing power to components of semiconductor devices, such as transistors within integrated circuits, has become increasingly challenging as circuit feature sizes and component pitches continue to get smaller. It is difficult to find space to provide the relatively large metal structures (vias) that are needed in order to convey sufficient current to the components of the devices. Some work has been done to resolve this problem by shifting the provision of power from a "frontside" of a semiconductor device (usually the last layers to be fabricated, at the "back-end-of-line" that is "above" the transistors and other components) to a "buried" layer of the semiconductor device (features located below the other components). However, this work has not entirely resolved the problem, in part because metal vias still are needed between the components in order to convey current from the buried layer to the frontside of the device where the components can receive it. Making the vias small enough to fit between components that are placed at contemporary small pitches (on the order of, e.g., <30 nm between components) causes the vias to have relatively high values of resistance.

SUMMARY

Principles of the invention provide techniques for improving via-to-backside-power-rail resistance.

An exemplary semiconductor device, according to an aspect of the invention, includes a backside power rail; a transistor source/drain structure that has a backside facing the backside power rail and has a frontside facing away from the backside power rail; and a via disposed between and electrically connecting the backside power rail and the source/drain structure. The via includes a buried portion that is disposed between the backside power rail and the backside of the transistor source/drain structure. A part of the buried portion overlaps and contacts at least a part of the backside of the source/drain structure. The via also includes a side portion that is electrically connected with the buried portion and extends along a vertical side of the source/drain structure between the frontside and the backside; and a top portion that is electrically connected with the side portion and covers at least a part of the frontside of the source/drain structure.

According to another aspect, an exemplary method includes providing a semiconductor structure that includes a backside power rail, a source/drain structure, and a via, which includes a buried portion that is disposed between the backside power rail and a backside of the source/drain structure, a side portion that extends along a vertical side of the source/drain structure from the buried portion to a frontside of the source/drain structure, and a top portion that extends across the frontside of the source/drain structure from the side portion. The buried portion of the via overlaps and contacts at least a portion of the backside of the source/drain structure. The exemplary method also includes delivering current from the backside power rail to the source/drain structure through the via.

According to another aspect, an exemplary method includes etching a trench into a blank that comprises a substrate, shallow trench isolation, and a source/drain structure. Etching the via for backside power rail trench removes a portion of the source/drain structure, a portion of the substrate, and a portion of the shallow trench isolation. The method also includes filling the trench with a first metal plug up to a backside of the source/drain structure; epitaxially regrowing the source/drain structure over a portion of the first metal plug; and filling the trench with a second metal plug that extends from the first metal plug alongside the source/drain structure and covers the source/drain structure.

In view of the foregoing, techniques of the present invention can provide substantial beneficial technical effects. For example, one or more embodiments provide one or more of:

Via-to-backside-power-rails with relatively low resistance, compared to prior art vias.

Improved delivery of current between buried power/ground rails and transistor source/drain structures.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

Figure 1:
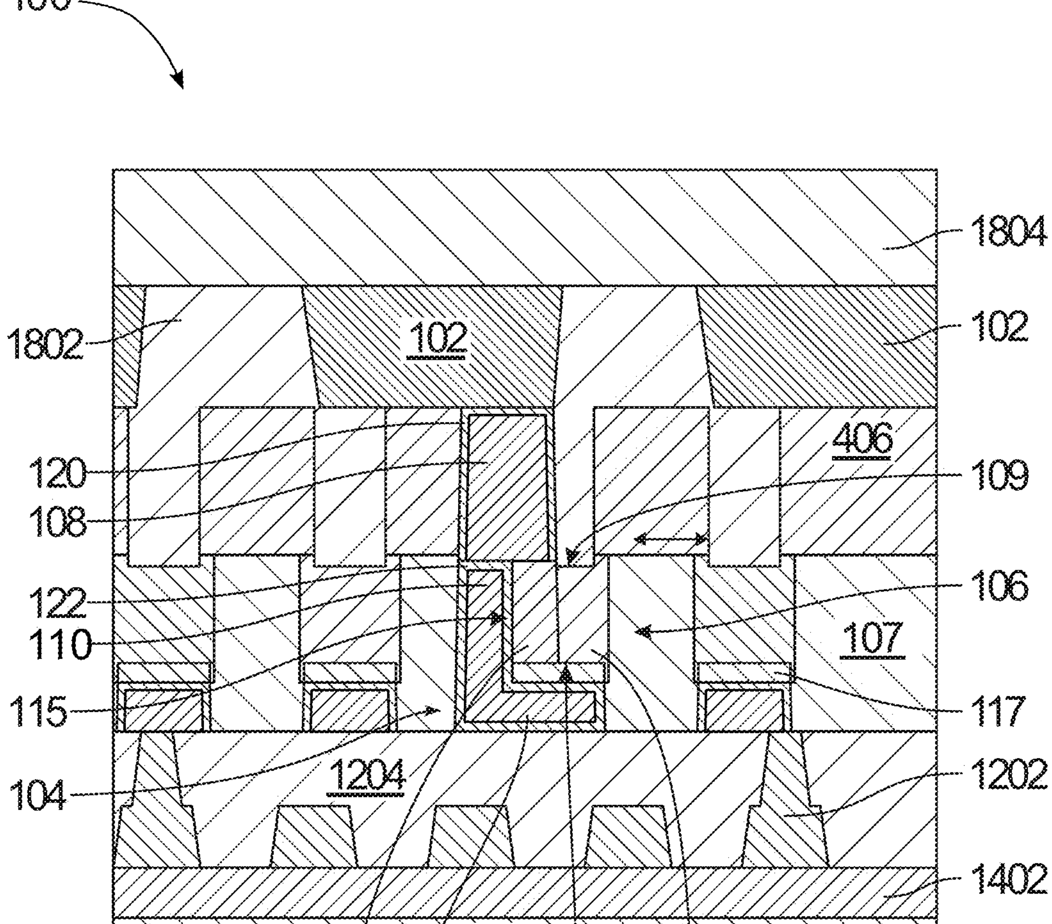
FIG. 1 depicts, in a schematic, a semiconductor device that has a backside power rail and a wraparound via, according to exemplary embodiments.

FIG. 1 depicts, in a schematic, a semiconductor device 100 that has a backside power rail 102 and a wraparound via 104, according to exemplary embodiments. The wraparound via 104 electrically connects the backside power rail 102 to a source/drain structure 106, which is formed in an interlayer dielectric 107. The wraparound via 104 includes a buried portion 108 (which is shown at the top or "backside" 109 of the source/drain structure 106 in FIG. 1), a side portion 110, and a top portion 112 (which is shown at the bottom or "frontside" 113 of the source/drain structure 106 in FIG. 1). In one or more embodiments, a part of the buried portion 108 overlaps and contacts at least a part of the backside 109 of the source/drain structure 106. In one or more embodiments, the side portion 110 is electrically connected with the buried portion and extends along a vertical side 115 of the source/drain structure 106 between the frontside and the backside. In one or more embodiments, the top portion 112 is electrically connected with the side portion 110 and covers at least a part of the frontside 113 of the source/drain structure. In one or more embodiments, the buried portion, the side portion, and the top portion wrap around part of the backside, the vertical side, and at least part of the frontside of the source/drain structure.

Typically, vias from backside power rails to source/drain structures have been on the order of 150 nanometers tall and 10 to 25 nanometers wide (high aspect ratio). Advantageously, the wraparound feature that is disclosed herein enables the bottom and top portions of the via to have a larger critical dimension than was available in prior art methods, e.g., 10-25 nanometers wider or 40-60% wider. A wider critical dimension reduces aspect ratio and advantageously reduces via resistance.

In one or more embodiments, as shown for example in FIG. 1, the top portion 112 extends across an entirety of the frontside 113 of the source/drain structure. In one or more embodiments, the side portion 110 has a smaller cross section than the buried portion 108 and has a smaller cross section than the top portion. In one or more embodiments, the top portion has a larger cross section than the buried portion.

In one or more embodiments, a silicide layer 117 is provided between the top portion 112 and the frontside 113 of the source/drain structure. Advantageously, providing the silicide layer can reduce contact resistance from the top portion of the via to the source/drain structure.

In some instances, the via includes a metal that is selected from the list consisting of: tungsten, cobalt, and ruthenium. Advantageously, in one or more embodiments low resistance, as compared to the prior art, is achieved by an inventive VBPR structure in accordance with one or more embodiments, not necessarily requiring the use of special "low resistance" materials.

The source/drain structure 106 has its backside 109 facing the backside power rail 102, and has its frontside 113 facing away from the backside power rail 102. The source/drain structure 106 includes an original portion 116 and a regrown portion 118.

A conductive liner 120 mechanically separates the side portion 110 and the top portion 112 from the source/drain structure 106 and the buried portion 108. The liner 120 electrically connects the via 104 to the source/drain structure 106. In one or more embodiments, the liner includes a conductive metal liner. For example, the liner includes titanium nitride. In one or more embodiments, a similar liner 122 underlies the buried portion 108. In one or more embodiments, the liners 120, 122 serve as diffusion barriers.

Other components of the semiconductor device 100 will be familiar to the skilled worker. Components that are numbered in FIG. 1, but not discussed here, are further described below to the extent that they relate to steps of a method for fabricating the semiconductor device 100. Elements 406, 1202, 1204, 1402, 1404, 1802, and 1804 are described below.

Figure 2:
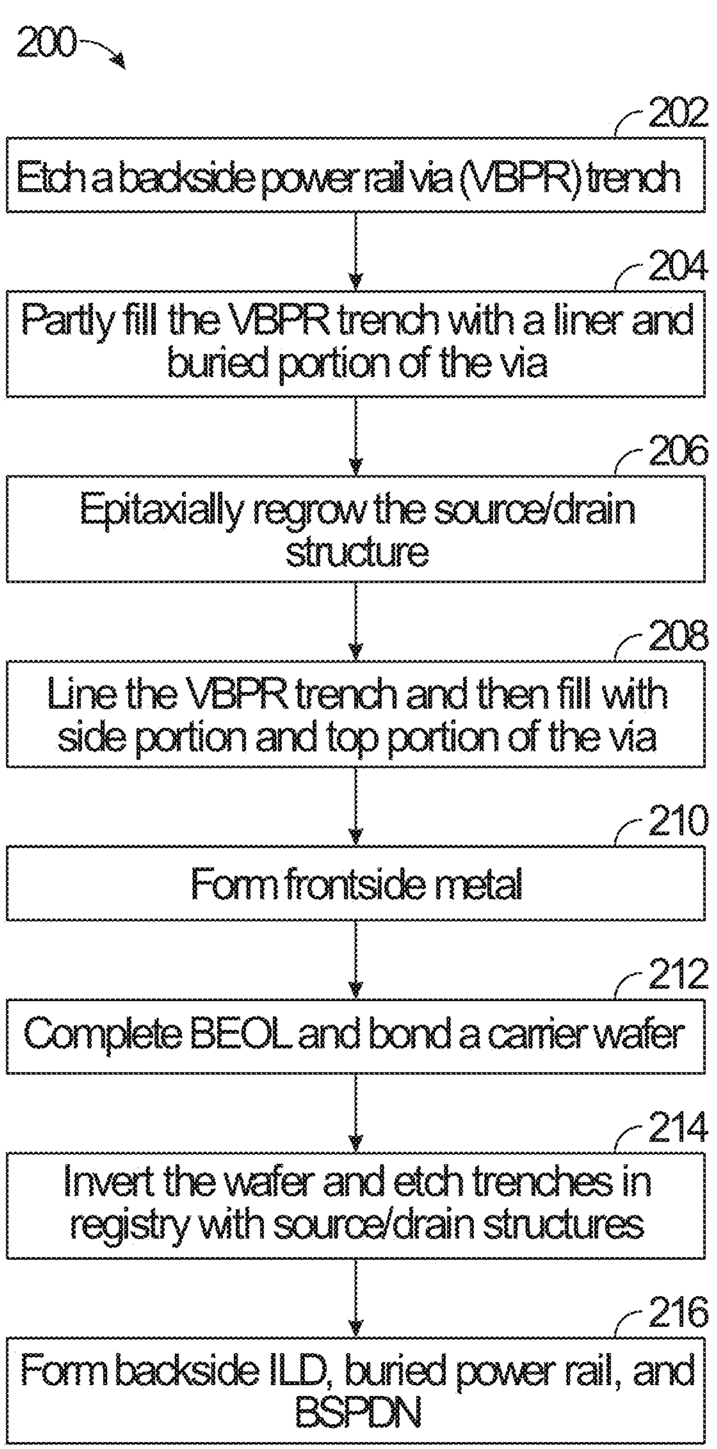
FIG. 2 depicts, in a flowchart, steps of a method for making the semiconductor device that is shown in FIG. 1.

FIG. 2 depicts, in a flowchart, steps of a method 200 for making the semiconductor device 100 that is shown in FIG. 1. FIG. 3 through FIG. 18 depict, in schematics, precursor and intermediate structures that are produced according to steps of the method 200 that is shown in FIG. 2.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

Figure 3:
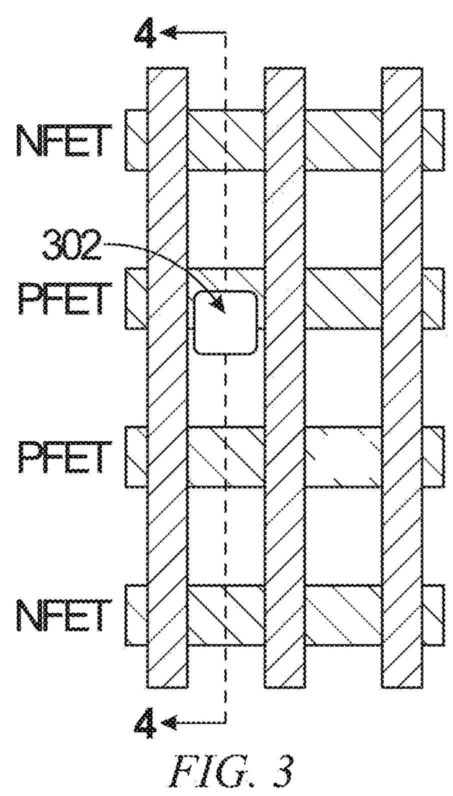
FIG. 3 through FIG. 18 depict, in schematics, precursor and intermediate structures that are produced according to steps of the method that is shown in FIG. 2.
Figure 4:
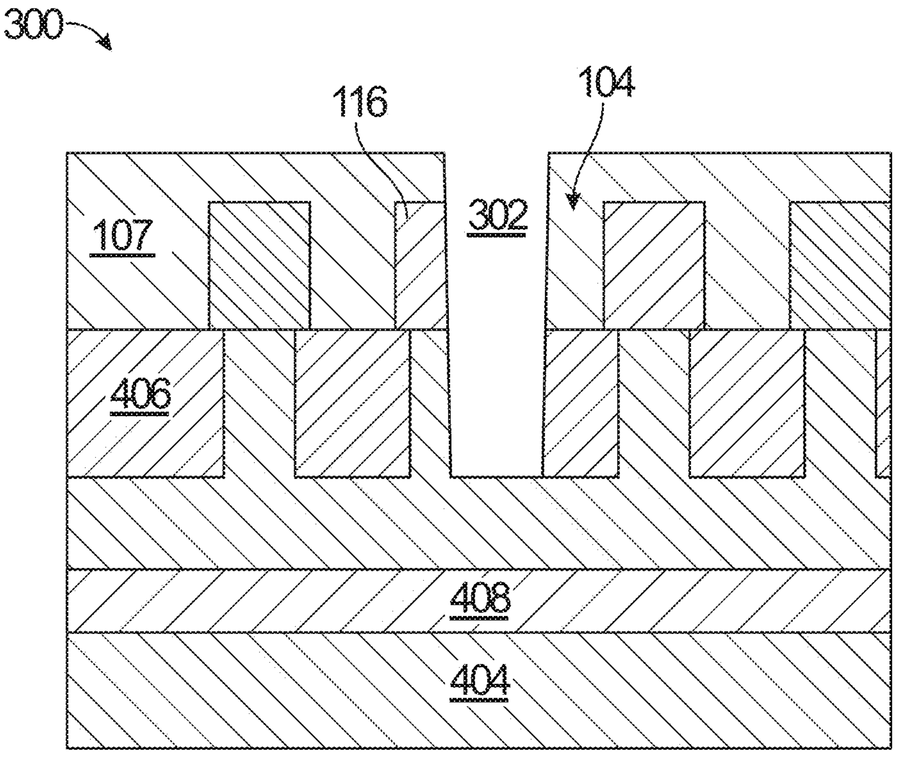

Referring to FIG. 2, FIG. 3, and FIG. 4 (taken at cutline 4 of FIG. 3), at 202, etch a via-to-backside-power-rail (VBPR) trench 302 into a blank 300 that comprises a substrate 404, shallow trench isolation 406, etch stop layer 408, and the source/drain structure 106 (see FIG. 1). Examples of etch stop layer can include a buried oxide, silicon-germanium alloy, or other materials as to which the substrate 404 selectively etches. The purpose of this etch stop layer is to overcome the depth delta generated during wafer backside substrate grinding, CMP and wet etch. This etch stop layer enables selectivity to the substrate and therefore after etch stop layer removal, the remaining substrate is considered as relatively flat. Etching the VBPR trench removes a portion of the source/drain structure, a portion of the substrate, a portion of the interlayer dielectric 107, and a portion of the shallow trench isolation 406, so that only the original portion 116 of the source/drain structure 106 remains in FIG. 4. It should be noted that, given the teachings herein, the skilled artisan can use known integrated circuit fabrication techniques to prepare the precursor structure shown in FIGS. 3 and 4. Furthermore, successively illustrated structures may have intervening steps/structures omitted for brevity, all of which will be within the capability of the skilled artisan, given the teachings herein.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

Figure 5:
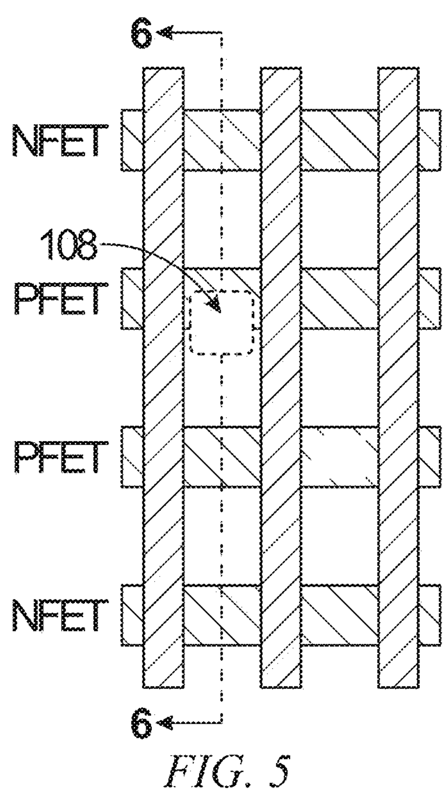
Figure 6:
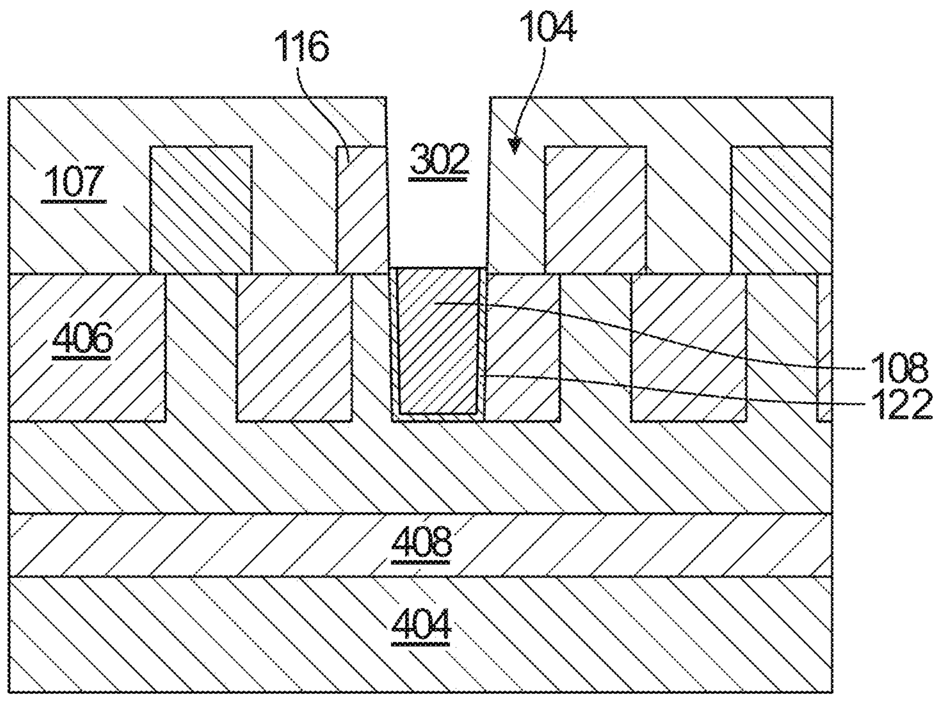

At 204, as shown in FIG. 2, FIG. 5, and FIG. 6 (taken at cutline 6 of FIG. 5), partly fill the VBPR trench 302 with the liner 122 and with a first metal plug, which forms the bottom portion 108 of what will be the via up to the backside 109 of the source/drain structure 106 (see FIG. 1). In one or more embodiments, the liner 122 includes a conductive metal liner. For example, the liner includes titanium nitride. In one or more embodiments, the liner 122 serves as a diffusion barrier. In one or more embodiments, the first metal plug or bottom portion 108 comprises a metal selected from the list consisting of: tungsten, cobalt, and ruthenium.

Figure 7:
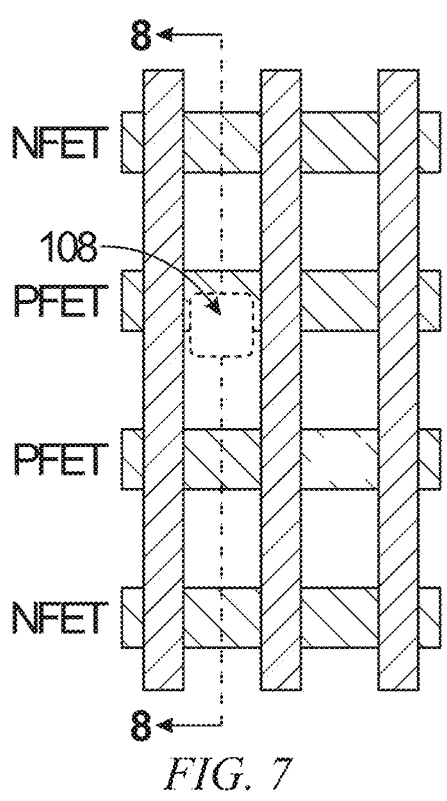
Figure 8:
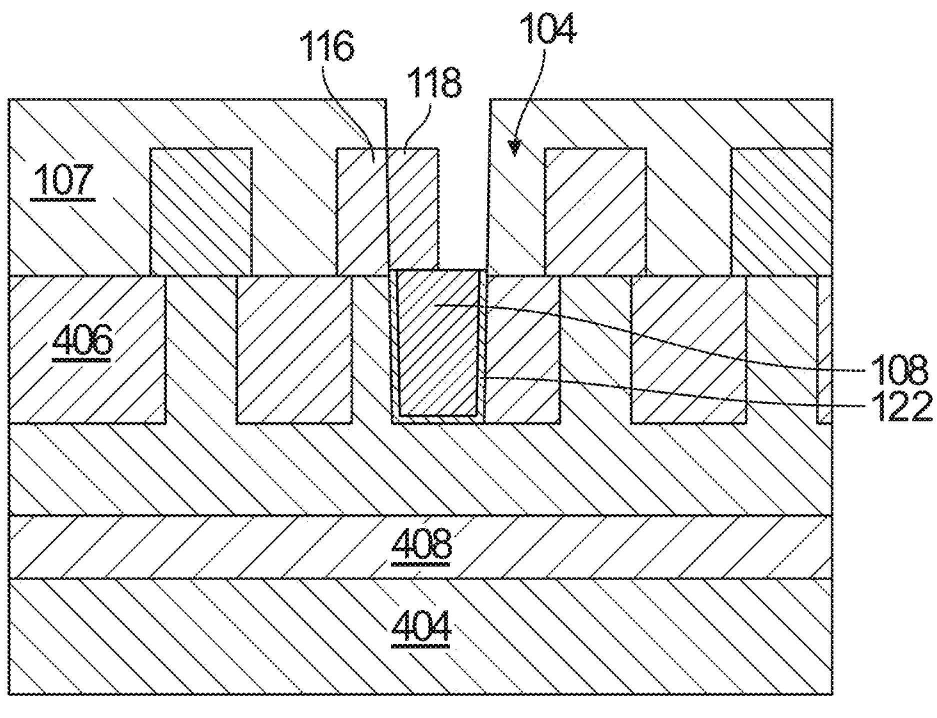

Then, referring to FIG. 2, FIG. 7, and FIG. 8 (taken at cutline 8 of FIG. 7), at 206, epitaxially regrow the source/drain structure 106 (see FIG. 1) (to form the regrown portion 118) over part of the bottom portion 108. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

Figure 9:
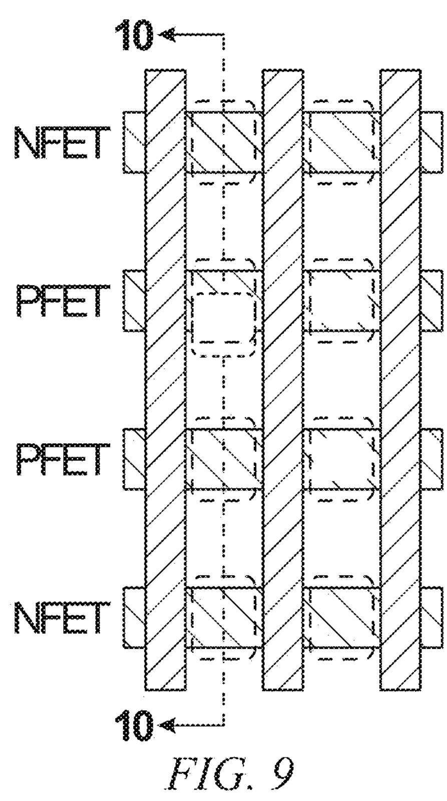
Figure 10:
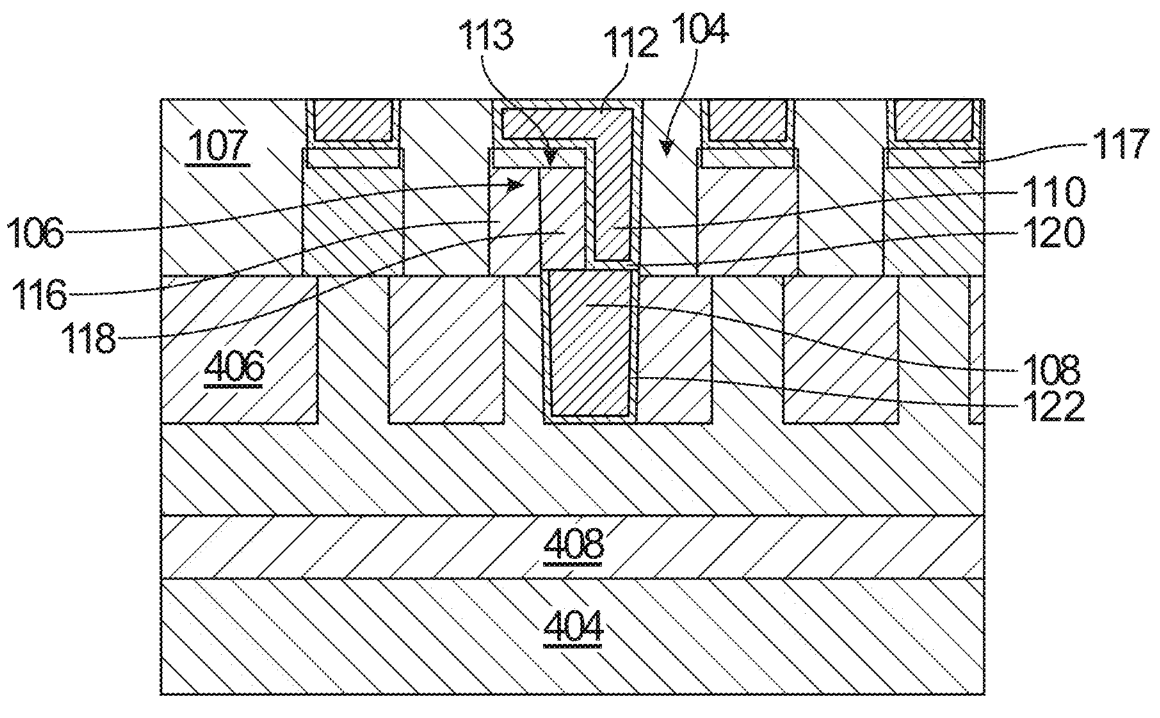

At 208, as shown in FIG. 2, FIG. 9, and FIG. 10 (taken at cutline 10 of FIG. 9), line the VBPR trench with the liner 120 over the source/drain structure 106 and the buried portion 108, and then completely fill the VBPR trench with a second metal plug that forms the side portion 110 and the top portion 112, extending from the bottom portion 108 alongside the source/drain structure 106 and covering the source/drain structure. In one or more embodiments, the liner 120 includes a conductive metal liner. For example, the liner comprises titanium nitride. In one or more embodiments, the liner 120 serves as a diffusion barrier. In one or more embodiments, the second metal plug or bottom portion 108 comprises a low-resistance metal. In one or more embodiments, the second metal plug comprises a (low resistance) metal selected from the list consisting of: tungsten, cobalt, and ruthenium.

In one or more embodiments, as shown in FIG. 10, the first metal plug is formed with a buried cross section 108, and the second metal plug is formed with a side cross section 110 that is smaller than the buried cross section and with a top cross section 112 that is bigger than the buried cross section.

In one or more embodiments, at least one of the first and second metal plugs is formed with a low-resistance metal. In at least some such embodiments, the low-resistance metal is selected from the list consisting of: tungsten, cobalt, and ruthenium.

Figure 11:
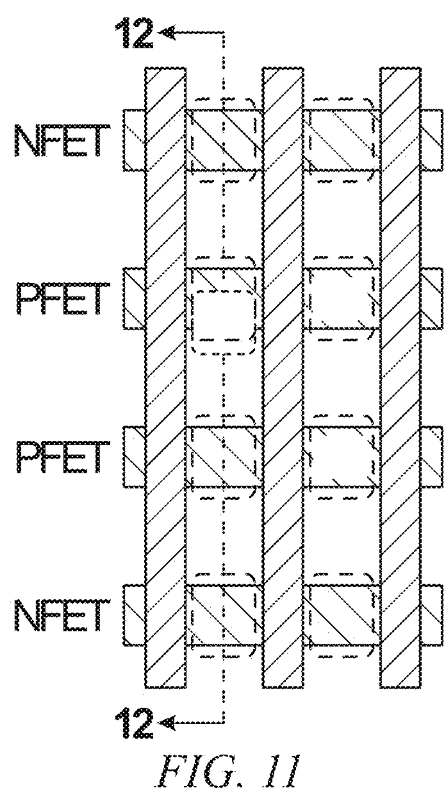
Figure 12:
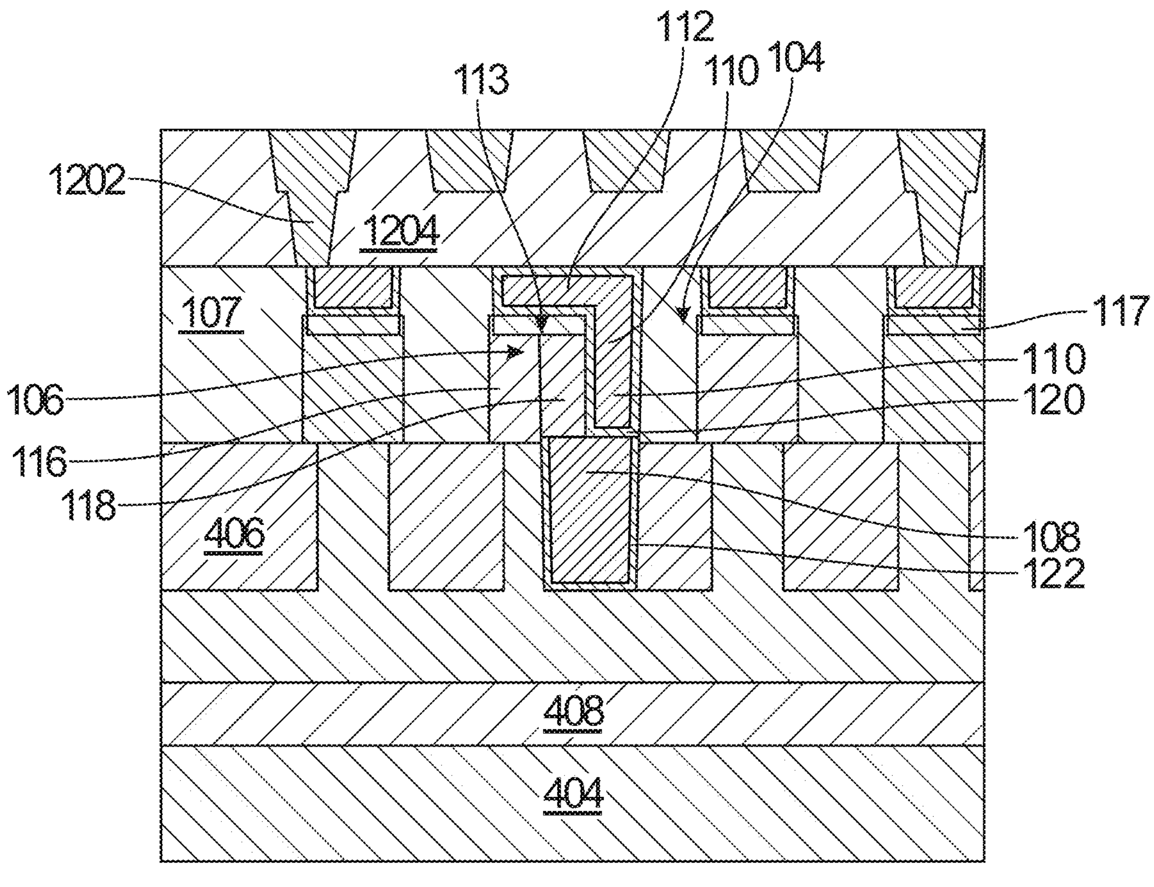
Figures 13, 14:
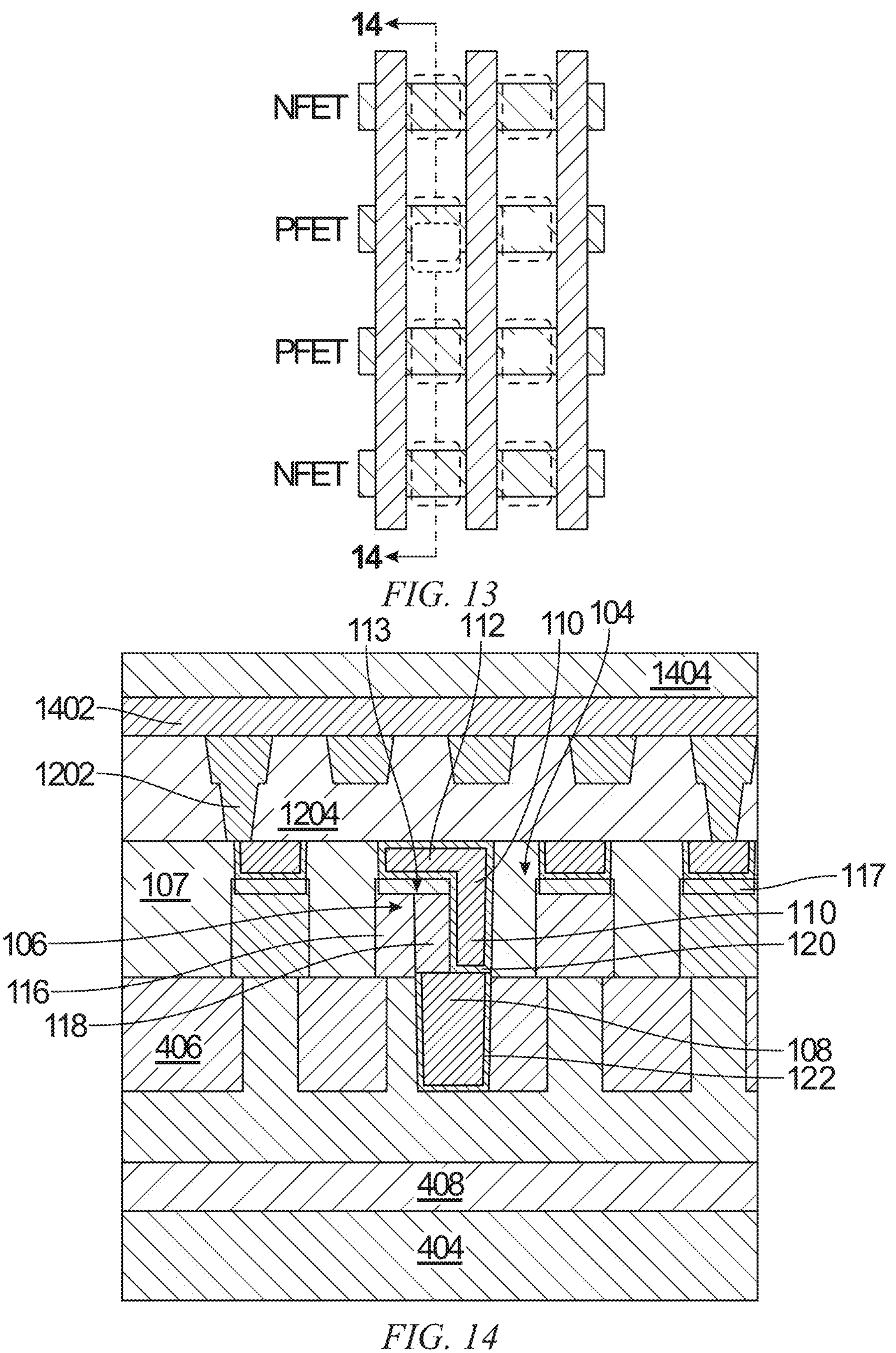

At 210, as shown in FIG. 2, FIG. 11, and FIG. 12 (taken at cutline 12 of FIG. 11), form frontside metal 1202 in an interlayer dielectric 1204. Referring to FIG. 2, FIG. 13, and FIG. 14 (taken at cutline 14 of FIG. 13), at 212, complete the back-end-of-line layers 1402 and bond a carrier wafer 1404. The ordinary skilled worker is familiar with purposes, functions, and structures of frontside metal in typical integrated circuits. Frontside metal includes top and side contacts, signal vias and traces, middle-of-line and back-end-of-line layers, etc. In one or more non-limiting and exemplary embodiments, frontside metal can comprise copper, aluminum, silver, and/or more refractory metals such as tungsten, cobalt, or ruthenium.

Figure 15:
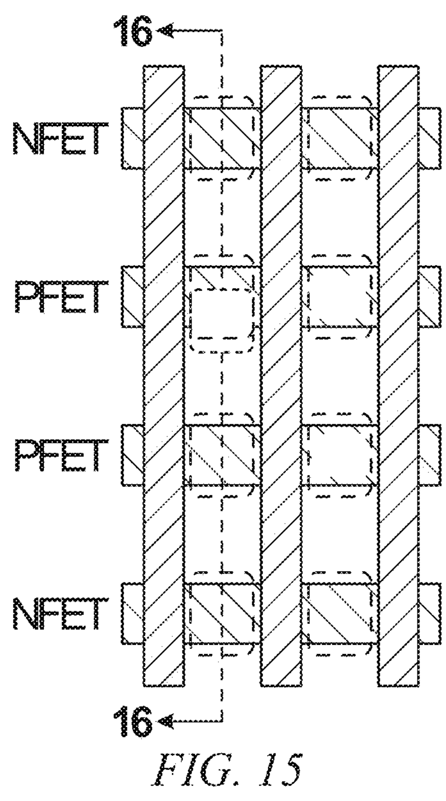
Figure 16:
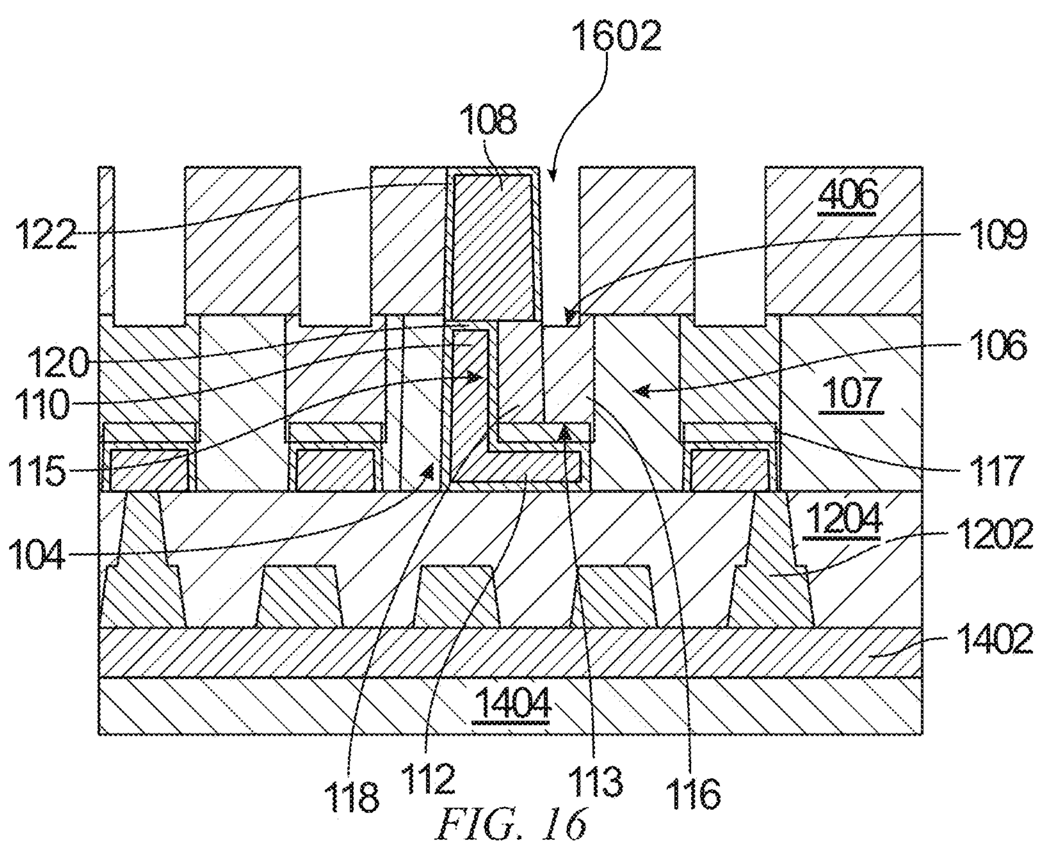

Then at 214, as shown in FIG. 2, FIG. 15, and FIG. 16 (taken at cutline 16 of FIG. 15), invert the wafer and etch the substrate 404 below etch stop layer 408, etch stop layer 408 and remaining substrate 404 (seen in FIG. 14) to form trenches 1602 in registry with the source/drain structures 106. In one or more embodiments, the liner 122 protects the buried portion 108 from etching.

Figure 17:
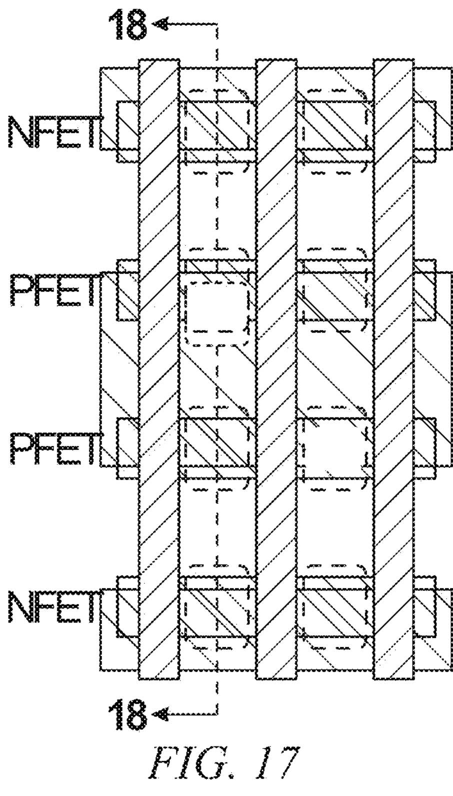
Figure 18:
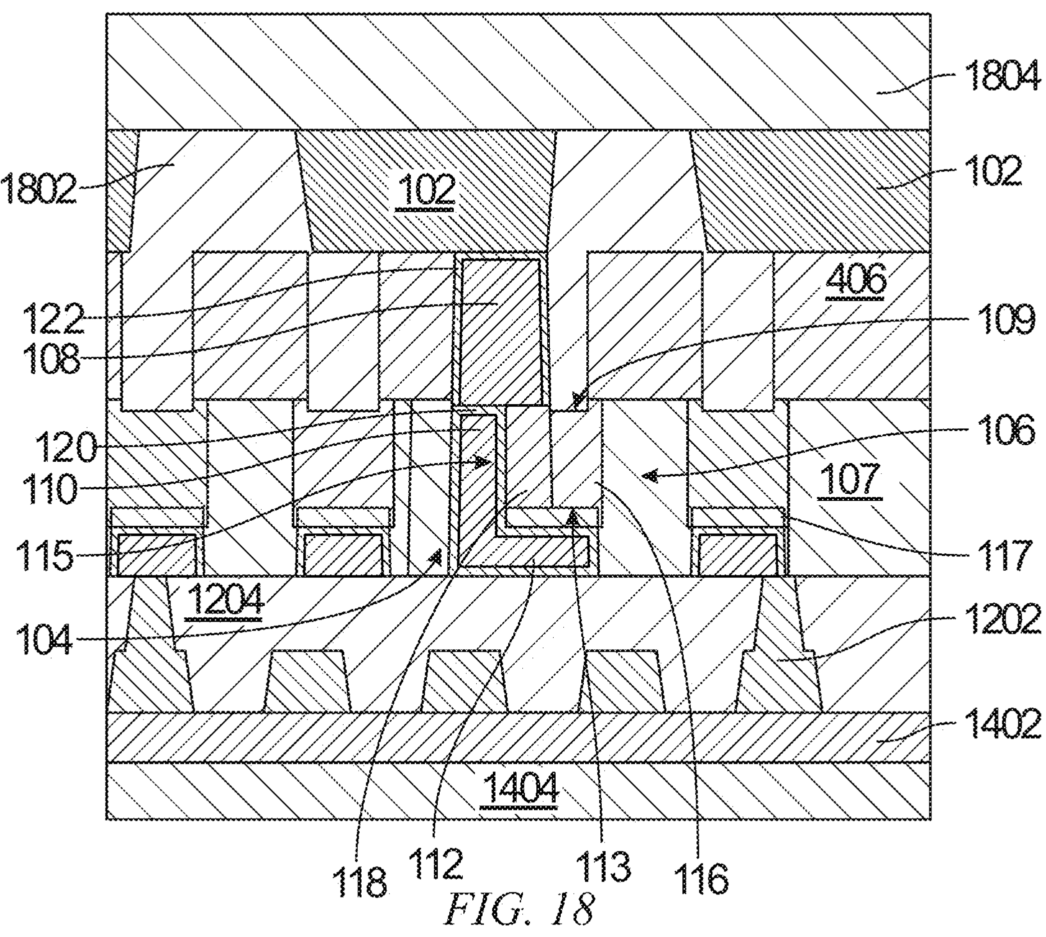

As shown in FIG. 2, FIG. 17, and FIG. 18 (taken at cutline 18 of FIG. 17), at 216 form backside interlayer dielectric 1802, backside power rail 102, and a backside power distribution network (BSPDN) 1804. Although BSPDN 1804 is not shown in detail, the ordinary skilled worker will appreciate that a power distribution network can include many metal traces of varying sizes in one or more layers that are intermingled with a dielectric or dielectrics.

In subsequent steps (not shown), the wafer is flipped again, and the carrier wafer is stripped, so that dice from the wafer (i.e., portions diced from the wafer) can be assembled with other chips or chiplets in a common orientation.

Given the discussion thus far, it will be appreciated that, in general terms, embodiments and aspects of the invention enable delivering current from a backside power rail 102 to a source/drain structure 106 through a via 104, which includes a buried portion 108 that is disposed between the backside power rail and a backside 109 of the source/drain structure, a side portion 110 that extends along a vertical side 115 of the source/drain structure from the buried portion to a frontside 113 of the source/drain structure, and a top portion 112 that extends across the frontside of the source/drain structure from the side portion, wherein the buried portion of the via overlaps and contacts at least a portion of the backside of the source/drain structure.

An exemplary semiconductor device, according to an aspect of the invention, includes a backside power rail 102; a transistor source/drain structure 106 that has a backside 109 facing the backside power rail and has a frontside 113 facing away from the backside power rail; and a via 104 that is disposed between and electrically connects the backside power rail and the source/drain structure. The via includes a buried portion 108 that is disposed between the backside power rail and the backside of the transistor source/drain structure. A part of the buried portion overlaps and contacts at least a part of the backside of the source/drain structure. The via also includes a side portion 110 that is electrically connected with the buried portion and extends along a vertical side of the source/drain structure between the frontside and the backside; and a top portion 112 that is electrically connected with the side portion and covers at least a part of the frontside of the source/drain structure.

In one or more embodiments, the buried portion, the side portion, and the top portion all are electrically connected with the source/drain structure.

In one or more embodiments, the via also includes a conductive liner 122 that mechanically separates the side portion and the top portion from the source/drain structure and electrically connects the via to the source/drain structure. In one or more embodiments, the conductive liner mechanically separates and electrically connects the side portion and the buried portion. In one or more embodiments, the conductive liner includes a conductive metal liner. In one or more embodiments, the conductive liner includes titanium nitride.

In one or more embodiments, the top portion extends across an entirety of the frontside of the source/drain structure.

In one or more embodiments, the side portion has a smaller cross section than the buried portion and has a smaller cross section than the top portion.

In one or more embodiments, the top portion has a larger cross section than the buried portion.

In one or more embodiments, the buried portion, the side portion, and the top portion wrap around part of the backside, the vertical side, and at least part of the frontside of the source/drain structure.

In one or more embodiments, the via includes a metal selected from the list consisting of: tungsten, cobalt, and ruthenium.

In one or more embodiments, the via is 100 to 150 nanometers tall from the buried portion to the top portion and is 20 to 30 nanometers wide at the buried portion.

According to another aspect, an exemplary method includes providing a semiconductor structure that includes a backside power rail 102, a source/drain structure 106, and a via 104, which includes a buried portion 108 that is disposed between the backside power rail and a backside of the source/drain structure, a side portion 110 that extends along a vertical side of the source/drain structure from the buried portion to a frontside of the source/drain structure, and a top portion 112 that extends across the frontside of the source/drain structure from the side portion. The buried portion of the via overlaps and contacts at least a portion of the backside of the source/drain structure. The exemplary method also includes delivering current from the backside power rail to the source/drain structure through the via.

According to another aspect, an exemplary method includes, at 202, etching a trench into a blank that comprises a substrate, shallow trench isolation, and a source/drain structure. Etching the trench removes a portion of the source/drain structure, a portion of the substrate, and a portion of the shallow trench isolation. The method also includes, at 204, filling the trench with a first metal plug up to a backside of the source/drain structure; at 206, epitaxially regrowing the source/drain structure over a portion of the first metal plug; and, at 208, filling the trench with a second metal plug that extends from the first metal plug alongside the source/drain structure and covers the source/drain structure.

In one or more embodiments, the method also includes, at 204, forming a liner onto the source/drain structure and onto the first metal plug before filling the trench with the second metal plug.

In one or more embodiments, the method also includes forming the liner with a conductive metal liner.

In one or more embodiments, the method also includes: forming the first metal plug with a buried cross section; and forming the second metal plug with a side cross section that is smaller than the buried cross section.

In one or more embodiments, the method also includes forming the second metal plug with a top cross section that is bigger than the buried cross section.

In one or more embodiments, the method also includes forming at least one of the first and second metal plugs with a metal selected from the list consisting of: tungsten, cobalt, and ruthenium.

In one or more embodiments, the method also includes etching the trench to a depth between 100 and 150 nanometers.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

What is claimed is:

1. A semiconductor device comprising:
- a backside power rail;
- a transistor source/drain structure that has a backside facing the backside power rail and has a frontside facing away from the backside power rail;
- a via disposed between and electrically connecting the backside power rail and the transistor source/drain structure, wherein the via comprises:
  - a buried portion that is disposed between the backside power rail and the backside of the transistor source/drain structure, wherein a part of the buried portion overlaps and contacts at least a part of the backside of the transistor source/drain structure;
  - a side portion that is electrically connected with the buried portion and extends along a vertical side of the transistor source/drain structure between the frontside and the backside; and a top portion that is electrically connected with the side portion and covers at least a part of the frontside of the transistor source/drain structure; and a conductive liner, wherein a portion of the conductive liner is disposed between the buried portion and the side portion and mechanically separates the buried portion and the side portion.

2. The semiconductor device of claim 1, wherein the buried portion, the side portion, and the top portion all are electrically connected with the transistor source/drain structure.

3. The semiconductor device of claim 1, wherein the conductive liner mechanically separates the side portion and the top portion from the source/drain structure and electrically connects the via to the transistor source/drain structure.

4. The semiconductor device of claim 3, wherein the conductive liner electrically connects the side portion and the buried portion.

5. The semiconductor device of claim 4, wherein the conductive liner comprises a conductive metal liner.

6. The semiconductor device of claim 5, wherein the conductive liner comprises titanium nitride.

7. The semiconductor device of claim 1, wherein the top portion extends across an entirety of the frontside of the transistor source/drain structure.

8. The semiconductor device of claim 1, wherein the side portion has a smaller cross section than the buried portion and has a smaller cross section than the top portion.

9. The semiconductor device of claim 8, wherein the top portion has a larger cross section than the buried portion.

10. The semiconductor device of claim 1, wherein the buried portion, the side portion, and the top portion wrap around at least a part of the backside, the vertical side, and at least a part of the frontside of the transistor source/drain structure.

11. The semiconductor device of claim 1, wherein the via comprises a metal selected from the list consisting of: tungsten, cobalt, and ruthenium.

12. The semiconductor device of claim 1, wherein the via is 100 to 150 nanometers tall from the buried portion to the top portion and is 20 to 30 nanometers wide at the buried portion.

13. A method comprising:

providing a semiconductor structure that includes a backside power rail, a source/drain structure, a via, and a conductive liner, wherein the via includes a buried portion that is disposed between the backside power rail and a backside of the source/drain structure, a side portion that extends along a vertical side of the source/drain structure from the buried portion to a frontside of the source/drain structure, and a top portion that extends across the frontside of the source/drain structure from the side portion, wherein the buried portion of the via overlaps and contacts at least a portion of the backside of the source/drain structure, and wherein a portion of the conductive liner is disposed between the buried portion and the side portion and mechanically separates the buried portion and the side portion; and delivering current from the backside power rail to the source/drain structure through the via.

* * * * *